(12) United States Patent
Takeda et al.

(10) Patent No.: US 6,641,975 B2
(45) Date of Patent: Nov. 4, 2003

(54) RESIST COMPOSITION AND PATTERNING PROCESS

(75) Inventors: Takanobu Takeda, Kubiki-mura (JP);
Osamu Watanabe, Kubiki-mura (JP);
Kazuhiro Hirahara, Kubiki-mura (JP);
Kazunori Maeda, Kubiki-mura (JP);
Wataru Kusaki, Kubiki-mura (JP);
Shigehiro Nagura, Kubiki-mura (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 10 days.

(21) Appl. No.: 09/928,455

(22) Filed: Aug. 14, 2001

(65) Prior Publication Data

US 2002/0039701 A1 Apr. 4, 2002

(30) Foreign Application Priority Data

Aug. 14, 2000 (JP) ........................................ 2000-245617

(51) Int. Cl.$^7$ ............................ G03C 1/73; G03F 7/039; G03F 7/20; G03F 7/30; G03F 7/38; G03F 7/40
(52) U.S. Cl. .................... 430/270.1; 430/905; 430/910; 430/914; 430/326; 430/327; 430/328; 430/330; 430/331; 526/313; 526/328.5
(58) Field of Search ............................ 430/270.1, 905, 430/910, 914, 326, 327, 328, 330, 331; 526/313, 328.5

(56) References Cited

U.S. PATENT DOCUMENTS

| | | | |
|---|---|---|---|
| 4,491,628 A | 1/1985 | Ito | |
| 4,603,101 A | 7/1986 | Crivello | |
| 5,310,619 A | 5/1994 | Crivello | |
| 5,324,804 A | 6/1994 | Steinmann | |
| 6,251,569 B1 * | 6/2001 | Angelopoulos et al. | ..... 430/325 |

FOREIGN PATENT DOCUMENTS

| | | |
|---|---|---|
| JP | 62-115440 A | 5/1987 |
| JP | 63-27829 A | 2/1988 |
| JP | 2-27660 B | 6/1990 |
| JP | 3-223858 A | 10/1991 |
| JP | 3-275149 A | 12/1991 |
| JP | 4-211258 A | 8/1992 |
| JP | 6-100488 A | 4/1994 |
| JP | 6-289608 A | 10/1994 |
| JP | 8-101509 A | 4/1996 |
| JP | 2000-89460 A | 3/2000 |

OTHER PUBLICATIONS

Derwent World Patent Index Abstract of JP 2–27660.
Derwent World Patent Index Abstract of JP 63–27829.
Derwent World Patent Index Abstract of JP 62–115440.
Derwent World Patent Index Abstract of JP 3–223858.
Derwent World Patent Index Abstract of JP 4–211258.
Derwent World Patent Index Abstract of JP 6–100488.
Derwent World Patent Index Abstract of JP 3–275149.
Derwent World Patent Index Abstract of JP 6–289608.
Derwent World Patent Index Abstract of JP 8–101509.
Derwent World Patent Index Abstract of JP 2000–89460.

* cited by examiner

*Primary Examiner*—Janet Baxter
*Assistant Examiner*—Sin J. Lee
(74) *Attorney, Agent, or Firm*—Millen, White, Zelano & Branigan, P.C.

(57) ABSTRACT

A ternary copolymer of hydroxystyrene, tertiary alkyl (meth)acrylate and substitutable phenoxyalkyl (meth)acrylate having a Mw of 1,000–500,000 is blended as a base resin to formulate a chemically amplified, positive resist composition which has advantages including a significantly enhanced contrast of alkali dissolution rate before and after exposure, high sensitivity, high resolution, a satisfactory pattern profile after exposure, high etching resistance, and process adaptability.

7 Claims, No Drawings

RESIST COMPOSITION AND PATTERNING PROCESS

This invention relates to a resist composition, typically chemically amplified positive resist composition, comprising a polymer in the form of a ternary copolymer of hydroxystyrene, tertiary alkyl (meth)acrylate and substitutable phenoxyalkyl (meth)acrylate as a base resin and a patterning process using the resist composition.

BACKGROUND OF THE INVENTION

While a number of recent efforts are being made to achieve a finer pattern rule in the drive for higher integration and operating speeds in LSI devices, deep-ultraviolet lithography is thought to hold particular promise as the next generation in microfabrication technology. Deep-UV lithography is capable of achieving a minimum feature size of 0.5 μm or less and, when a resist having low light absorption is used, can form patterns with sidewalls that are nearly perpendicular to the substrate.

Recently developed acid-catalyzed chemical amplification positive resists, such as those described in JP-B 2-27660, JP-A 63-27829, U.S. Pat. Nos. 4,491,628 and 5,310,619, utilize a high-intensity KrF excimer laser as the deep-UV light source. These resists, with their excellent properties such as high sensitivity, high resolution, and good dry etching resistance, are especially promising for deep-UV lithography.

Such chemically amplified positive resists include two-component systems comprising a base resin and a photoacid generator, and three-component systems comprising a base resin, a photoacid generator, and a dissolution inhibitor having acid labile groups.

For example, JP-A 62-115440 describes a resist material comprising poly-4-tert-butoxystyrene and a photoacid generator, and JP-A 3-223858 describes a similar two-component resist material comprising a resin bearing tert-butoxy groups within the molecule, in combination with a photoacid generator. JP-A 4-211258 describes a two-component resist material which is comprised of polyhydroxystyrene bearing methyl, isopropyl, tert-butyl, tetrahydropyranyl, and trimethylsilyl groups, together with a photoacid generator.

JP-A 6-100488 discloses a resist material comprised of a polydihydroxystyrene derivative, such as poly[3,4-bis(2-tetrahydropyranyloxy)styrene], poly[3,4-bis(tert-butoxycarbonyloxy)styrene] or poly[3,5-bis(2-tetrahydropyranyloxy)styrene], and a photoacid generator.

The base resins in these resist materials bear acid labile groups on side chains. When these acid labile groups are groups such as tert-butyl and tert-butoxycarbonyl which are cleaved by strong acids, the resist pattern tends to take on a T-top profile. By contrast, when the acid labile groups are alkoxyalkyl groups such as ethoxyethyl which are cleaved by weak acids, the corresponding resins have the drawback that the pattern configuration is considerably narrowed as the time interval between exposure and heat treatment increases. Moreover, the presence of bulky groups on the side chains lowers the heat resistance of the resin and leads to an unsatisfactory sensitivity and resolution. These problems have hitherto prevented the practical implementation of either approach, and workable solutions have been sought.

To provide higher transparency and firm adhesion to substrates and to improve footing on substrates and etching resistance, JP-A 3-275149 and 6-289608 propose a resist material using a copolymer of hydroxystyrene and tertiary alkyl (meth)acrylate. The resist material of this type suffers from poor heat resistance and an indefinite pattern profile after exposure and is not satisfactory in resolution as well.

Likewise, JP-A 8-101509 discloses a resist material using a ternary copolymer of hydroxystyrene, tertiary alkyl (meth)acrylate and substitutable alkyl (meth)acrylate. Merely introducing a common substitutable alkyl (meth)acrylate as the third component fails to overcome the above-mentioned problems and rather detracts from resolution. A copolymer having a phenoxyethyl group introduced into the ester group of (meth)acrylic acid is known from JP-A 2000-89460 as achieving an improvement in the run length of lithographic printing plates, but its application to chemically amplified resist materials has not been attempted.

SUMMARY OF THE INVENTION

An object of the invention is to provide a positive resist composition, especially chemically amplified positive resist composition, which is superior to prior art positive resist compositions in sensitivity, resolution, exposure latitude and process flexibility, and has a satisfactory pattern profile after exposure and high etching resistance.

It has been found that a polymer having recurring units of the following general formula (1) or (2) and having a weight average molecular weight of 1,000 to 500,000 is an effective base resin in a positive resist composition, especially chemically amplified positive resist composition. The chemically amplified positive resist composition containing a photoacid generator and an organic solvent as well as the polymer has many advantages including an increased dissolution contrast of a resist film, high resolution, improved latitude of exposure, improved process flexibility, a good pattern profile after exposure, and high etching resistance. The composition is thus suited for practical use and advantageously used in precise microfabrication, especially in VLSI manufacture.

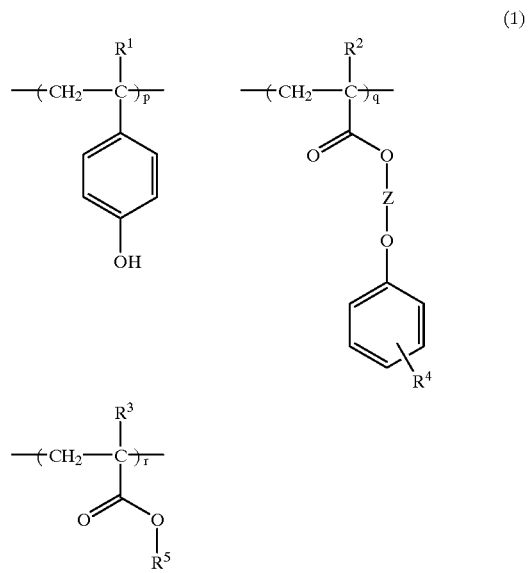

Herein $R^1$, $R^2$ and $R^3$ each are hydrogen or methyl, Z is a straight, branched or cyclic alkylene group of 2 to 10 carbon atoms, $R^4$ is hydrogen or a straight, branched or cyclic alkyl group of 1 to 10 carbon atoms, which may contain an oxygen atom, $R^5$ is a tertiary alkyl group of 5 to 20 carbon atoms, p, q and r are positive numbers satisfying p+q+r=1.

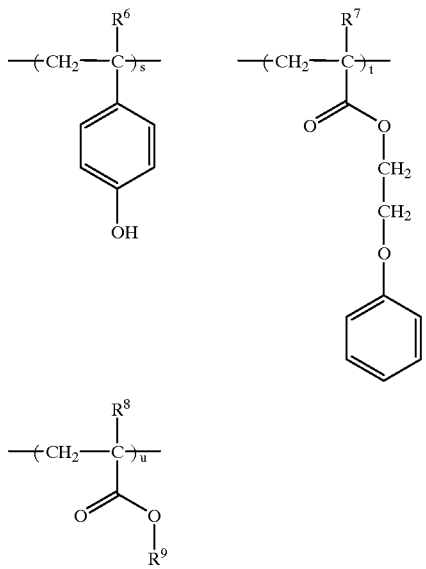

(2)

Herein $R^6$, $R^7$ and $R^8$ each are hydrogen or methyl, $R^9$ is a tertiary alkyl group of 5 to 20 carbon atoms, s, t and u are positive numbers satisfying s+t+u=1.

The polymer of formula (1) or (2) is a ternary copolymer of a hydroxystyrene, a tertiary alkyl (meth)acrylate and a substitutable phenoxyalkyl (meth)acrylate. When the polymer is formulated as a base resin in a resist composition along with a photoacid generator, the substitutable phenoxyalkyl (meth)acrylate introduced as the third component of the copolymer makes it possible to control the diffusion rate of the photoacid generator. As a consequence, the composition has a high resolution, forms an improved pattern profile after exposure, and exhibits high etching resistance.

Undesirably, a resist composition having formulated therein a binary copolymer of a hydroxystyrene and a tertiary alkyl (meth)acrylate forms a degraded pattern profile after exposure, is unsatisfactory in resolution and etching resistance, and leaves footings on the pattern.

In contrast, a chemically amplified positive resist composition having formulated therein the ternary copolymer of formula (1) or (2) as a base resin has substantially overcome the problems including a degraded pattern profile after exposure, the lack of heat resistance, partial pattern collapse and footings, and as a result, has a high sensitivity, high resolution, etching resistance and process flexibility.

Accordingly, the present invention, in a first aspect, provides a resist composition comprising a polymer having recurring units of the general formula (1) or (2) and having a weight average molecular weight of 1,000 to 500,000.

In a second aspect, the invention provides a chemically amplified positive resist composition comprising (A) an organic solvent, (B) the polymer of formula (1) or (2) as a base resin, and (C) a photoacid generator; or (A) an organic solvent, (B) the polymer of formula (1) or (2) as a base resin, (C) a photoacid generator, and (D) a dissolution regulator; or (A) an organic solvent, (B) the polymer of formula (1) or (2) as a base resin, (C) a photoacid generator, (D) a dissolution regulator, and (E) a basic compound.

In a third aspect, the invention provides a process for forming a resist pattern comprising the steps of applying the resist composition onto a substrate to form a coating; heat treating the coating and then exposing it to high-energy radiation or electron beams through a photo mask; and optionally heat treating the exposed coating and developing it with a developer.

DESCRIPTION OF THE PREFERRED EMBODIMENT

The polymers or high molecular weight compounds of the invention are copolymers having respective units of the following general formula (1) or (2).

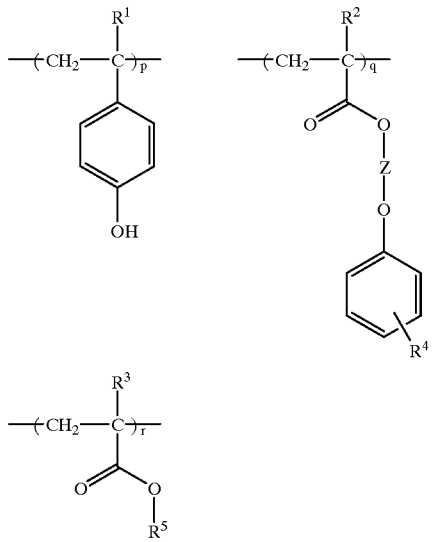

(1)

Herein $R^1$, $R^2$ and $R^3$ each are hydrogen or methyl, Z is a straight, branched or cyclic alkylene group of 2 to 10 carbon atoms, $R^4$ is hydrogen, a straight, branched or cyclic alkyl group of 1 to 10 carbon atoms, or a straight, branched or cyclic alkyl group of 1 to 10 carbon atoms containing an oxygen atom, $R^5$ is a tertiary alkyl group of 5 to 20 carbon atoms, p, q and r are positive numbers satisfying p+q+r=1.

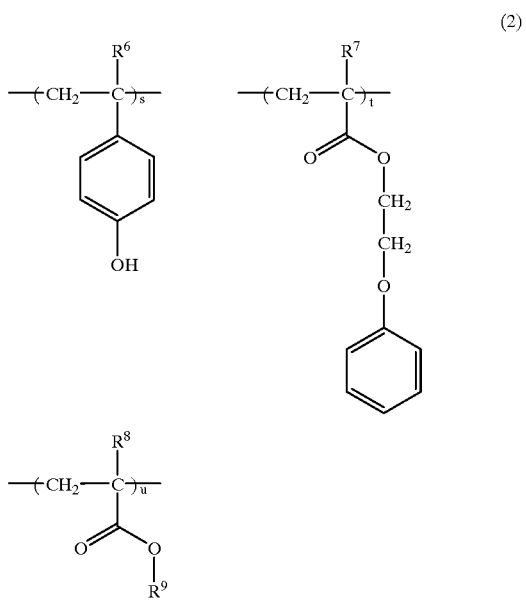

(2)

Herein $R^6$, $R^7$ and $R^8$ each are hydrogen or methyl, $R^9$ is a tertiary alkyl group of 5 to 20 carbon atoms, s, t and u are positive numbers satisfying s+t+u=1.

In the above formulae, Z is a straight, branched or cyclic alkylene group of 2 to 10 carbon atoms. Excluded are those alkylene groups in which two or more oxygen atoms are attached to one carbon in Z. That is, the substitutable phenoxyalkyl (meth)acrylates including Z must be acid stable groups. If the substitutable phenoxyalkyl (meth) acrylate is an acid labile group, the substitutable phenoxyalkyl moiety is eliminated from the polymer backbone as a result of the acid being generated upon exposure, so that the polymer encounters difficulty in exerting its own function. Another problem in the event of an acid labile group is extremely low storage stability. Examples of Z are ethylene, propylene, butylene and cyclohexylene, though not limited thereto.

Examples of the oxygen atom-containing alkyl group represented by $R^4$ include alkoxy and alkoxyalkoxy groups. Illustrative examples of $R^4$ include, but are not limited to, hydrogen, methyl, ethyl, methoxy, t-butoxy, and ethoxyethoxy.

Illustrative examples of the substitutable phenoxyalkyl (meth)acrylate including Z, as understood from the above discussion, are given below.

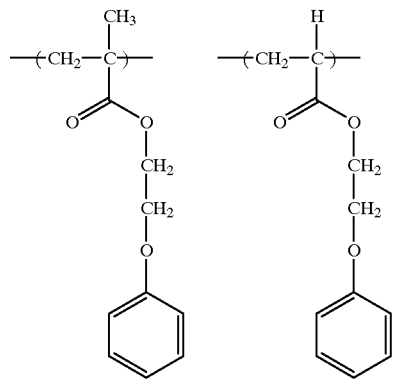

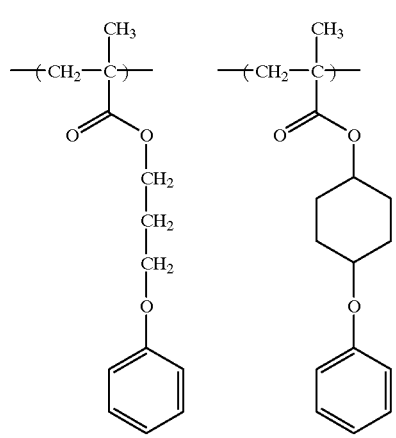

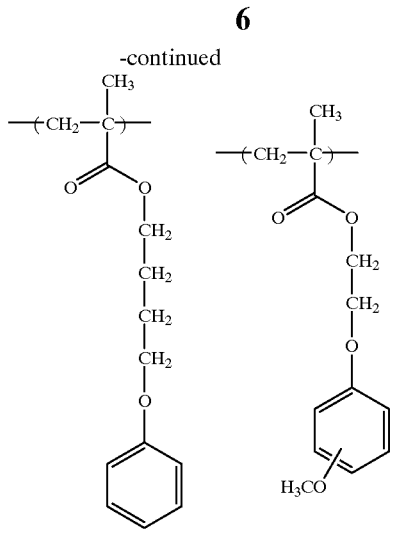

-continued

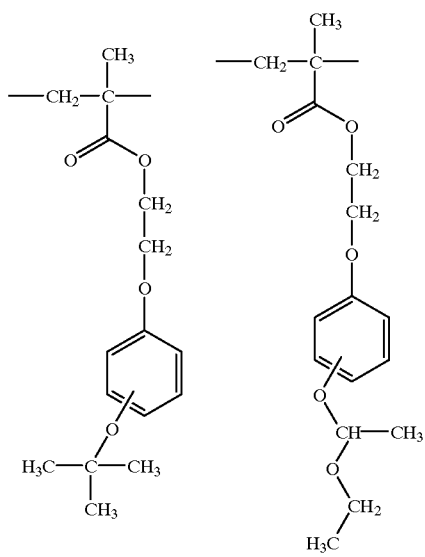

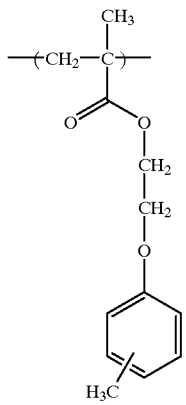

In formulae (1) and (2), the tertiary alkyl groups represented by $R^5$ and $R^9$ include a variety of such groups, and are especially those groups of the following general formulae (3) and (4).

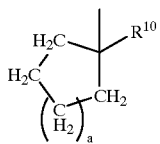
(3)

Herein, $R^{10}$ is a methyl, ethyl, isopropyl, cyclohexyl, cyclopentyl, vinyl, acetyl, phenyl, benzyl or cyano group, and "a" is an integer of 0 to 3.

The cyclic alkyl groups of formula (3) are preferably 5-membered rings. Examples include 1-methylcyclopentyl, 1-ethylcyclopentyl, 1-isopropylcyclopentyl, 1-vinylcyclopentyl, 1-acetylcyclopentyl, 1-phenylcyclopentyl, 1-cyanocyclopentyl, 1-methylcyclohexyl, 1-ethylcyclohexyl, 1-isopropylcyclohexyl, 1-vinylcyclohexyl, 1-acetylcyclohexyl, 1-phenylcyclohexyl, and 1-cyanocyclohexyl.

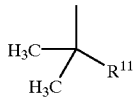
(4)

Herein, $R^{11}$ is an isopropyl, cyclohexyl, cyclopentyl, vinyl, phenyl, benzyl or cyano group.

Illustrative examples of formula (4) include 1-vinyldimethyl, 1-benzyldimethyl, 1-phenyldimethyl and 1-cyanodimethyl.

In formula (1), subscripts p, q and r are positive numbers satisfying p+q+r=1, and preferably satisfying the following relationship:

$$0<r/(p+q+r)\leq 0.5, \text{ especially } 0.1<r/(p+q+r)\leq 0.25,$$

and $$0<q/(p+q+r)\leq 0.2, \text{ especially } 0.02<q/(p+q+r)\leq 0.15.$$

If r=0, meaning that the polymer of formula (1) does not contain the corresponding units, the contrast of alkali dissolution rate lowers, detracting from resolution. If the proportion of p is too large, unexposed areas may have a too high alkali dissolution rate. If q=0, there appear drawbacks such as a low resolution and poor dry etching resistance. By properly selecting the values of p, q and r within the above range, the size and configuration of a resist pattern can be controlled as desired.

For the same reason, subscripts s, t and u in formula (2) are positive numbers, exclusive of 0, satisfying s+t+u=1, and preferably satisfying the following relationship:

$$0<u/(s+t+u)\leq 0.5, \text{ especially } 0.1<u/(s+t+u)\leq 0.25,$$

and $$0<t/(s+t+u)\leq 0.2, \text{ especially } 0.02<t/(s+t+u)\leq 0.15.$$

The polymer of the invention should have a weight average molecular weight of 1,000 to 500,000, preferably 3,000 to 30,000, as measured by a method to be described later. With too low a weight average molecular weight, resists would be less resistant to heat. With too high a weight average molecular weight, alkali solubility lowers and a footing phenomenon often occurs after pattern formation.

It is recommended that a ternary copolymer of hydroxystyrene, tertiary alkyl (meth)acrylate and substitutable phenoxyalkyl (meth)acrylate have a controlled molecular weight dispersity (Mw/Mn). If a copolymer has a wide dispersity, it contains more polymer fractions of low molecular weight and high molecular weight and thus forms a pattern after exposure with foreign matter left thereon or its shape disrupted. The influence of a molecular weight and its dispersity becomes greater as the pattern rule becomes finer. In order that a resist composition be advantageously used in patterning features to a finer size, the copolymer should preferably be a narrow disperse one having a molecular weight dispersity of 1.0 to 2.0, especially 1.0 to 1.5.

In one typical embodiment, the copolymer can be synthesized by dissolving an acetoxystyrene monomer, a tertiary alkyl (meth)acrylate monomer and a substitutable phenoxyalkyl (meth)acrylate monomer in an organic solvent, adding a radical initiator thereto, heat polymerizing the monomers, and subjecting the resulting polymer to alkaline hydrolysis in an organic solvent for deblocking the acetoxy group, thereby forming a ternary copolymer of hydroxystyrene, tertiary alkyl (meth)acrylate and substitutable phenoxyalkyl (meth)acrylate. Examples of the organic solvent used in polymerization include toluene, benzene, tetrahydrofuran, diethyl ether, and dioxane. Representative of the polymerization initiator are 2,2'-azobisisobutyronitrile, 2,2'-azobis(2,4-dimethylvaleronitrile), dimethyl-2,2-azobis(2-methylpropionate), benzoyl peroxide and lauroyl peroxide. Polymerization may be effected by heating at about 50 to 80° C. The reaction time is usually about 2 to 100 hours, preferably about 5 to 20 hours. The base used in the alkaline hydrolysis is selected from aqueous ammonia and triethylamine, to name a few. The reaction temperature is about −20° C. to 100° C., preferably about 0 to 60° C. The reaction time is usually about 0.2 to 100 hours, preferably about 0.5 to 20 hours. It is noted that the synthesis procedure is not limited to the aforementioned.

In the chemically amplified, positive working resist composition of the invention, component (A) is an organic solvent. Illustrative, non-limiting, examples include butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethylsulfoxide, γ-butyrolactone, propylene glycol methyl ether acetate, propylene glycol ethyl ether acetate, propylene glycol propyl ether acetate, methyl lactate, ethyl lactate, propyl lactate, and tetramethylene sulfone. Of these, the propylene glycol alkyl ether acetates and alkyl lactates are especially preferred. The solvents may be used alone or in admixture of two or more. An exemplary useful solvent mixture is a mixture of a propylene glycol alkyl ether acetate and an alkyl lactate. It is noted that the alkyl groups of the propylene glycol alkyl ether acetates are preferably those of 1 to 4 carbon atoms, for example, methyl, ethyl and propyl, with methyl and ethyl being especially preferred. Since the propylene glycol alkyl ether acetates include 1,2- and 1,3-substituted ones, each includes three isomers depending on the combination of substituted positions, which may be used alone or in admixture. It is also noted that the alkyl groups of the alkyl lactates are preferably those of 1 to 4 carbon atoms, for example, methyl, ethyl and propyl, with methyl and ethyl being especially preferred.

When the propylene glycol alkyl ether acetate is used as the solvent, it preferably accounts for at least 50% by weight of the entire solvent. Also when the alkyl lactate is used as the solvent, it preferably accounts for at least 50% by weight of the entire solvent. When a mixture of propylene glycol alkyl ether acetate and alkyl lactate is used as the solvent, that mixture preferably accounts for at least 50% by weight of the entire solvent. In this solvent mixture, it is further preferred that the propylene glycol alkyl ether acetate is 60 to 95% by weight and the alkyl lactate is 40 to 5% by weight. A lower proportion of the propylene glycol alkyl ether acetate would invite a problem of inefficient coating whereas a higher proportion thereof would provide insufficient dissolution and allow for particle and foreign matter formation. A lower proportion of the alkyl lactate would provide insufficient dissolution and cause the problem of many particles and foreign matter whereas a higher proportion thereof would lead to a composition which has a too high viscosity to apply and loses storage stability.

Usually the solvent is used in amounts of about 300 to 2,000 parts, preferably about 400 to 1,000 parts by weight per 100 parts by weight of the solids in the chemically amplified positive resist composition. The concentration is not limited to this range as long as film formation by existing methods is possible.

The photoacid generator (C) is a compound capable of generating an acid upon exposure to high energy radiation. Preferred photoacid generators are sulfonium salts, iodonium salts, sulfonyldiazomethanes, and N-sulfonyloxyimides. These photoacid generators are illustrated below while they may be used alone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, and tribenzylsulfonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4,4-toluenesulfonyloxybenzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodinium salts are salts of iodonium cations with sulfonates. Exemplary iodinium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4,4-toluenesulfonyloxybenzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and sulfonylcarbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate photoacid generators include pyrogallol, fluoroglycine, catechol, resorcinol, and hydroquinone, in which all the hydroxyl groups are replaced by trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is replaced by a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p- toluenesulfonyl)propane, and 2,4-dimethyl-2-(p-toluenesulfonyl)pentan-3-one.

Photoacid generators in the form of glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexylsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Of these photoacid generators, the sulfonium salts, bis-sulfonyldiazomethane compounds, and N-sulfonyloxyimide compounds are preferred.

While the anion of the optimum acid to be generated differs depending on the ease of scission of acid labile groups introduced in the polymer, an anion which is non-volatile and not extremely diffusive is generally chosen. The preferred anions include benzenesulfonic acid anions, toluenesulfonic acid anions, 4,4-toluenesulfonyloxybenzenesulfonic acid anions, pentafluorobenzenesulfonic acid anions, 2,2,2-trifluoroethanesulfonic acid anions, nonafluorobutanesulfonic acid anions, heptadecafluorooctanesulfonic acid anions, and camphorsulfonic acid anions.

In the chemically amplified positive resist composition, an appropriate amount of the photoacid generator (C) is 0 to 20 parts, more preferably 0.5 to 20 parts, and especially 1 to 10 parts by weight per 100 parts by weight of the solids in the composition. The photoacid generators may be used alone or in admixture of two or more. The transmittance of the resist film can be controlled by using a photoacid generator having a low transmittance at the exposure wavelength and adjusting the amount of the photoacid generator added.

The dissolution regulator (D) is a compound having on the molecule at least two phenolic hydroxyl groups, in which an average of from 10 to 100 mol % of all the hydrogen atoms on the phenolic hydroxyl groups are replaced with acid labile groups. The compound has a weight average molecular weight within the range of 100 to 1,000, and preferably 150 to 800. The dissolution regulator may be formulated in an amount of 0 to 50 parts, preferably 5 to 50 parts, and more preferably 10 to 30 parts by weight, per 100 parts by weight of the base resin, and may be used singly or as a mixture of two or more thereof. Less amounts of the dissolution regulator may fail to yield an improved resolution, whereas too much amounts would lead to slimming of the patterned film, and thus a decline in resolution.

Illustrative, non-limiting, examples of the dissolution regulator (D) which are useful herein include
bis(4-(2'-tetrahydropyranyloxy)phenyl)methane,
bis(4-(2'-tetrahydrofuranyloxy)phenyl)methane,
bis(4-tert-butoxyphenyl)methane,
bis(4-tert-butoxycarbonyloxyphenyl)methane,
bis(4-tert-butoxycarbonylmethyloxyphenyl)methane,
bis(4-(1'-ethoxyethoxy)phenyl)methane,
bis(4-(1'-ethoxypropyloxy)phenyl)methane,
2,2-bis(4'-(2"-tetrahydropyranyloxy))propane,
2,2-bis(4'-(2"-tetrahydrofuranyloxy)phenyl)propane,
2,2-bis(4'-tert-butoxyphenyl)propane,
2,2-bis(4'-tert-butoxycarbonyloxyphenyl)propane,
2,2-bis(4-tert-butoxycarbonylmethyloxyphenyl)propane,
2,2-bis(4'-(1"-ethoxyethoxy)phenyl)propane,
2,2-bis(4'-(1"-ethoxypropyloxy)phenyl)propane,
tert-butyl 4,4-bis(4'-(2"-tetrahydropyranyloxy)phenyl) valerate,
tert-butyl 4,4-bis(4'-(2"-tetrahydrofuranyloxy)phenyl) valerate,
tert-butyl 4,4-bis(4'-tert-butoxyphenyl)valerate,
tert-butyl 4,4-bis(4-tert-butoxycarbonyloxyphenyl)valerate,
tert-butyl 4,4-bis(4'-tert-butoxycarbonylmethyloxyphenyl) valerate,
tert-butyl 4,4-bis(4'-(1"-ethoxyethoxy)phenyl)valerate,
tert-butyl 4,4-bis(4'-(1"-ethoxypropyloxy)phenyl)valerate,
tris(4-(2'-tetrahydropyranyloxy)phenyl)methane,
tris(4-(2'-tetrahydrofuranyloxy)phenyl)methane,
tris(4-tert-butoxyphenyl)methane,
tris(4-tert-butoxycarbonyloxyphenyl)methane,
tris(4-tert-butoxycarbonyloxymethylphenyl)methane,
tris(4-(1'-ethoxyethoxy)phenyl)methane,
tris(4-(1'-ethoxypropyloxy)phenyl)methane,
1,1,2-tris(4'-(2"-tetrahydropyranyloxy)phenyl)ethane,
1,1,2-tris(4'-(2"-tetrahydrofuranyloxy)phenyl)ethane,
1,1,2-tris(4'-tert-butoxyphenyl)ethane,
1,1,2-tris(4'-tert-butoxycarbonyloxyphenyl)ethane,
1,1,2-tris(4'-tert-butoxycarbonylmethyloxyphenyl)ethane,
1,1,2-tris(4'-(1'-ethoxyethoxy)phenyl)ethane, and
1,1,2-tris(4'-(1'-ethoxypropyloxy)phenyl)ethane.

The basic compound (E) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

Also useful are substituted ones of the hydroxyl group-bearing nitrogenous compounds in which some or all of the hydrogen atoms of hydroxyl groups are replaced by methyl, ethyl, methoxymethyl, methoxyethoxymethyl, acetyl, or ethoxyethyl groups. Preferred are methyl-, acetyl-, methoxymethyl- and methoxyethoxymethyl-substituted compounds of ethanolamine, diethanolamine and triethanolamine. Examples include tris(2-methoxyethyl)amine, tris(2-ethoxyethyl)amine, tris(2-acetoxyethyl)amine, tris{(2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, and tris[2-{(2-hydroxyethoxy)ethoxy}ethyl]amine.

The basic compounds may be used alone or in admixture of two or more. The basic compound is preferably formulated in an amount of 0 to 2 parts, and especially 0.01 to 1 part by weight, per 100 parts by weight of the solids in the resist composition. The use of more than 2 parts of the basis compound would result in too low a sensitivity.

In the resist composition, a surfactant may be added for improving coating characteristics. Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products K.K.), Megaface F171, F172 and F173 (Dai-Nippon Ink & Chemicals K.K.), Florade FC430 and FC431 (Sumitomo 3M K.K.), Asahiguard AG710, Surflon S-381, S-382, SC101, SC102, SC103, SC104, SC105, SC106, Surfynol E1004, KH-10, KH-20, KH-30 and KH-40 (Asahi Glass K.K.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo K.K.). Inter alia, FC430, Surflon S-381, Surfynol E1004, KH-20 and KH-30 are preferred. These surfactants may be used alone or in admixture.

In the resist composition, the surfactant is preferably formulated in an amount of up to 2 parts, and especially up to 1 part by weight, per 100 parts by weight of the solids in the resist composition.

For the microfabrication of integrated circuits, any well-known lithography may be used to form a resist pattern from the chemical amplification, positive working, resist composition comprising (A) an organic solvent, (B) the polymer of formula (1) or (2), and (C) a photoacid generator, as illustrated above, according to the invention.

The composition is applied onto a substrate (e.g., Si, $SiO_2$, SiN, SiON, TiN, WSi, BPSG, SOG, organic anti-reflecting film, etc.) by a suitable coating technique such as spin coating, roll coating, flow coating, dip coating, spray coating or doctor coating. The coating is prebaked on a hot plate at a temperature of 60 to 150° C. for about 1 to 10 minutes, preferably 80 to 120° C. for 1 to 5 minutes. The resulting resist film is generally 0.1 to 2.0 µm thick. With a mask having a desired pattern placed above the resist film, the resist film is then exposed to actinic radiation, preferably having an exposure wavelength of up to 300 nm, such as UV, deep-UV, electron beams, x-rays, excimer laser light, γ-rays and synchrotron radiation in an exposure dose of about 1 to 200 $mJ/cm^2$, preferably about 10 to 100 $mJ/cm^2$. The film is further baked on a hot plate at 60 to 150° C. for 1 to 5 minutes, preferably 80 to 120° C. for 1 to 3 minutes (post-exposure baking =PEB).

Thereafter the resist film is developed with a developer in the form of an aqueous base solution, for example, 0.1 to 5%, preferably 2 to 3% aqueous solution of tetramethylammonium hydroxide (TMAH) for 0.1 to 3 minutes, preferably 0.5 to 2 minutes by conventional techniques such as dipping, puddling or spraying. In this way, a desired resist pattern is formed on the substrate. It is appreciated that the resist composition of the invention is best suited for micropatterning using such actinic radiation as deep UV with a wavelength of 254 to 193 nm, vacuum UV with a wavelength of 157 nm, electron beams, soft x-rays, x-rays, excimer laser light, γ-rays and synchrotron radiation. With any of the above-described parameters outside the above-described range, the process may sometimes fail to produce the desired pattern.

EXAMPLE

Examples of the invention are given below by way of illustration and not by way of limitation. The abbreviation AIBN is azobisisobutyronitrile, Mw is a weight average molecular weight, Mn is a number average molecular weight, Mw/Mn is a molecular weight dispersity, NMR is nuclear magnetic resonance, GPC is gel permeation chromatography.

Synthesis Example 1

To a 2-liter flask were added 52.4 g of acetoxystyrene, 10.6 g of phenoxyethyl methacrylate, 17.0 g of 1-ethylcyclopentyl methacrylate and 160 g of toluene as a solvent. The reactor was cooled to −70° C. in a nitrogen atmosphere, whereupon vacuum deaeration and nitrogen blow were repeated three times. The reactor was warmed up to room temperature, 3.1 g of AIBN was added as a polymerization initiator, and the reactor was further heated to 60° C., at which reaction was effected for 15 hours. The reaction solution was concentrated to a ½ volume, poured into a mixture of 4.5 liters methanol and 0.5 liter water for precipitation. The resulting white solids were filtered and vacuum dried at 60° C., obtaining 72 g of a white polymer. The polymer was dissolved in a mixture of 0.5 liter methanol and 1.0 liter tetrahydrofuran again, to which 70 g of triethylamine and 15 g of water were added to effect deblocking reaction. The reaction solution was neutralized with acetic acid, concentrated, and dissolved in 0.5 liter of acetone. Following precipitation, filtration and drying in the same way as above, 58 g of a white polymer was obtained.

The polymer was analyzed by $^{13}C$—NMR, $^1H$—NMR and GPC, with the analytical results shown below.

Copolymer compositional ratio=hydroxystyrene:phenoxyethyl methacrylate:1-ethylcyclopentyl methacrylate=70:9.5:20.5

Mw=16,000

Mw/Mn=1.65

This polymer is designated Poly-A.

Synthesis Example 2

To a 2-liter flask were added 52.9 g of acetoxystyrene, 14.4 g of phenoxyethyl methacrylate, 12.7 g of 1-ethylcyclopentyl methacrylate and 160 g of toluene as a solvent. The reactor was cooled to −70° C. in a nitrogen atmosphere, whereupon vacuum deaeration and nitrogen blow were repeated three times. The reactor was warmed up to room temperature, 3.1 g of AIBN was added as a polymerization initiator, and the reactor was further heated to 60° C., at which reaction was effected for 15 hours. The reaction solution was concentrated to a ½ volume, poured into a mixture of 4.5 liters methanol and 0.5 liter water for precipitation. The resulting white solids were filtered and vacuum dried at 60° C., obtaining 74 g of a white polymer. The polymer was dissolved in a mixture of 0.5 liter methanol and 1.0 liter tetrahydrofuran again, to which 70 g of triethylamine and 15 g of water were added to effect deblocking reaction. The reaction solution was neutralized with acetic acid, concentrated, and dissolved in 0.5 liter of acetone. Following precipitation, filtration and drying in the same way as above, 59 g of a white polymer was obtained.

The polymer was analyzed by $^{13}C$—NMR, $^1H$—NMR and GPC, with the analytical results shown below.

Copolymer compositional ratio=hydroxystyrene:phenoxyethyl methacrylate:1-ethylcyclopentyl methacrylate=70:14.5:15.5

Mw=16,300

Mw/Mn=1.68

This polymer is designated Poly-B.

Synthesis Example 3

To a 2-liter flask were added 52.0 g of acetoxystyrene, 12.0 g of 4-methylphenoxyethyl methacrylate, 16.3 g of 1-ethylcyclopentyl methacrylate and 160 g of toluene as a solvent. The reactor was cooled to −70° C. in a nitrogen atmosphere, whereupon vacuum deaeration and nitrogen blow were repeated three times. The reactor was warmed up to room temperature, 3.0 g of AIBN was added as a polymerization initiator, and the reactor was further heated to 60° C., at which reaction was effected for 15 hours. The reaction solution was concentrated to a ½ volume, poured into a mixture of 4.5 liters methanol and 0.5 liter water for precipitation. The resulting white solids were filtered and vacuum dried at 60° C., obtaining 73 g of a white polymer. The polymer was dissolved in a mixture of 0.5 liter methanol and 1.0 liter tetrahydrofuran again, to which 70 g of triethylamine and 15 g of water were added to effect deblocking reaction. The reaction solution was neutralized with acetic acid, concentrated, and dissolved in 0.5 liter of acetone. Following precipitation, filtration and drying in the same way as above, 59 g of a white polymer was obtained.

The polymer was analyzed by $^{13}C$—NMR, $^1H$—NMR and GPC, with the analytical results shown below.

Copolymer compositional ratio=hydroxystyrene:4-methylphenoxyethyl methacrylate:1-ethylcyclopentyl methacrylate=70:9.2:20.8

Mw=16,900

Mw/Mn=1.70

This polymer is designated Poly-C.

Ternary polymers were likewise synthesized. Their composition and analytical results are shown below.

Copolymer compositional ratio=hydroxystyrene:phenoxybutyl methacrylate:1-ethylcyclopentyl methacrylate=70:9.8:20.2

Mw=17,100
Mw/Mn=1.71
This polymer is designated Poly-D.
Copolymer compositional ratio=hydroxystyrene:phenoxyethyl methacrylate:1-benzylcyclopentyl methacrylate=72:9.1:18.9

Mw=16,500
Mw/Mn=1.64
This polymer is designated Poly-E.
Copolymer compositional ratio=hydroxystyrene:phenoxyethyl methacrylate:benzyldimethyl methacrylate=72:8.9:19.1

Mw=16,800
Mw/Mn=1.65
This polymer is designated Poly-F.

Comparative Synthesis Examples

Binary polymers were likewise synthesized. Their composition and analytical results are shown below.
Copolymer compositional ratio=hydroxystyrene:1ethylcyclopentyl methacrylate=71:29

Mw=16,100
Mw/Mn=1.70
This polymer is designated Poly-G.
Copolymer compositional ratio=hydroxystyrene:1-benzylcyclopentyl methacrylate=74:26

Mw=16,000
Mw/Mn=1.68
This polymer is designated Poly-H.
Copolymer compositional ratio = hydroxystyrene:benzyldimethyl methacrylate=72.5:27.5

Mw=17,000
Mw/Mn=1.71
This polymer is designated Poly-I.

Examples 1–7 & Comparative Examples 1–3

Resist compositions were prepared according to the formulation shown in Tables 1 and 2. The polymers are Poly-A to I obtained in the above Synthesis Examples and Comparative Synthesis Examples, and the remaining components listed in Tables 1 and 2 have the following meaning.

PAG1: triphenylsulfonium 4-(4'-methylphenylsulfonyloxy)phenylsulfonate
PAG2: (4-tert-butylphenyl)diphenylsulfonium 4-(4'-methylphenylsulfonyloxy)phenylsulfonate
PAG3: bis(cyclohexylsulfonyl)diazomethane
PAG4: bis(2,4-dimethylphenylsulfonyl)diazomethane
Dissolution regulator A: bis(4-(2'-tetrahydropyranyloxy)phenyl)methane
Basic compound A: tris(2-methoxyethyl)amine
Surfactant A: FC-430 (Sumitomo 3M K.K.)
Surfactant B: Surflon S-381 (Asahi Glass K.K.)
Solvent A: propylene glycol methyl ether acetate
Solvent B: ethyl lactate

TABLE 1

| Components (pbw) | E1 | E2 | E3 | E4 | E5 |
|---|---|---|---|---|---|
| Poly-A | 80 | 80 | — | — | — |
| Poly-B | — | — | 80 | — | — |
| Poly-C | — | — | — | 80 | — |
| Poly-D | — | — | — | — | 80 |
| PAG 1 | 2 | 2 | 2 | 2 | 2 |
| PAG 2 | 1 | 0.5 | 1 | 1 | 1 |
| PAG 3 | — | 0.5 | — | — | — |
| PAG 4 | — | — | — | — | — |
| Dissolution regulator A | — | 0.01 | — | — | — |
| Basic compound A | 0.2 | 0.2 | 0.2 | 0.2 | 0.2 |
| Surfactant A | 0.07 | 0.07 | 0.07 | 0.07 | 0.07 |
| Surfactant B | 0.07 | 0.07 | 0.07 | 0.07 | 0.07 |
| Solvent A | 300 | 300 | 300 | 300 | 300 |
| Solvent B | 130 | 130 | 130 | 130 | 130 |

TABLE 2

| Components (pbw) | E6 | E7 | CE1 | CE2 | CE3 |
|---|---|---|---|---|---|
| Poly-E | 80 | — | — | — | — |
| Poly-F | — | 80 | — | — | — |
| Poly-G | — | — | 80 | — | — |
| Poly-H | — | — | — | 80 | — |
| Poly-I | — | — | — | — | 80 |
| PAG 1 | 2 | 2 | 2 | 2 | 2 |
| PAG 2 | 0.5 | 0.5 | 1 | 1 | 1 |
| PAG 3 | 0.5 | — | — | — | — |
| PAG 4 | — | 0.5 | — | — | — |
| Dissolution regulator A | — | — | — | — | — |
| Basic compound A | 0.2 | 0.2 | 0.2 | 0.2 | 0.2 |
| Surfactant A | 0.07 | 0.07 | 0.07 | 0.07 | 0.07 |
| Surfactant B | 0.07 | 0.07 | 0.07 | 0.07 | 0.07 |
| Solvent A | 300 | 300 | 300 | 300 | 300 |
| Solvent B | 130 | 130 | 130 | 130 | 130 |

The resist materials thus obtained were each filtered through a 0.2-$\mu$m Teflon filter, thereby giving resist solutions. These resist solutions were spin-coated onto silicon wafers, then baked on a hot plate at 100° C. for 90 seconds to give resist films having a thickness of 0.6 $\mu$m.

The resist films were exposed using an excimer laser stepper NSR2005EX (Nikon K.K., NA 0.5), then baked at 110° C. for 90 seconds (post-exposure baking: PEB), and developed with a solution of 2.38% tetramethylammonium hydroxide in water, thereby giving positive patterns (Examples 1–7 and Comparative Examples 1–3).

The resulting resist patterns were evaluated as described below.

Resist Pattern Evaluation

The exposure dose which provides a 1:1 resolution at the top and bottom of a 0.18-$\mu$m line-and-space pattern was the optimum exposure dose (sensitivity Eop). The minimum line width of a line-and-space pattern which was ascertained separate at this dose was the resolution of a test resist. The shape in cross section of the resolved resist pattern was examined under a scanning electron microscope.

The PED stability of a resist was evaluated by effecting post-exposure bake (PEB) after 24 hours of holding from exposure at the optimum dose and determining a variation in line width. The less the variation, the greater is the PED dimensional stability.

Other Evaluation

With respect to the slimming of resist film after development, the cross section of the resist film was observed under a scanning electron microscope. Film thickness change was rated "good" when the reduction of film thickness is within 0.5% (within 0.003 $\mu$m) based on the coated film thickness (0.6 $\mu$m) prior to development, "somewhat poor" for a thickness reduction within 1%, and "poor" for a thickness reduction of more than 1%.

With respect to the dry etching resistance after development, the resist film was etched, and a cross section of the pattern shape was observed under a scanning electron microscope. As a relative evaluation, the shape was rated good, somewhat poor or poor.

The results are shown in Table 3.

TABLE 3

| | Sensitivity (mJ/cm$^2$) | Resolution ($\mu$m) | Profile | PED stability (nm) | Film thickness change | Etching resistance |
|---|---|---|---|---|---|---|
| E1 | 27 | 0.14 | rectangular | −8 | good | somewhat poor |
| E2 | 26 | 0.14 | rectangular | −8 | good | somewhat poor |
| E3 | 33 | 0.15 | somewhat tapered | −6 | good | good |
| E4 | 29 | 0.14 | rectangular | −9 | good | good |
| E5 | 29 | 0.14 | rectangular | −8 | good | somewhat poor |
| E6 | 27 | 0.15 | rectangular | −7 | good | good |
| E7 | 30 | 0.15 | rectangular | −7 | good | good |
| CE1 | 28 | 0.16 | somewhat tapered | −10 | somewhat poor | poor |
| CE2 | 31 | 0.18 | somewhat tapered | −11 | somewhat poor | somewhat poor |
| CE3 | 32 | 0.18 | somewhat tapered | −13 | somewhat poor | somewhat poor |

There have been described resist compositions in which a ternary copolymer of hydroxystyrene, tertiary alkyl (meth) acrylate and substitutable phenoxyalkyl (meth)acrylate is blended as the base resin. The inventive compositions are best suited as chemically amplified, positive resist compositions having advantages including a significantly enhanced contrast of alkali dissolution rate before and after exposure, high sensitivity, high resolution, a satisfactory pattern profile after exposure, high etching resistance, and process adaptability.

Japanese Patent Application No. 2000-245617 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A chemically amplified positive resist composition comprising:

(A) an organic solvent, (B) a base resin of a polymer having recurring units of the following general formula (1) and having a weight average molecular weight of 1,000 to 500,000,

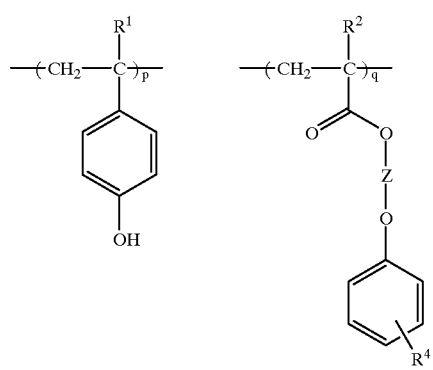

(1)

-continued

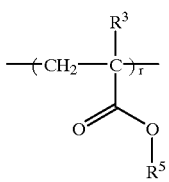

wherein $R^1$, $R^2$ and $R^3$ each are hydrogen or methyl, Z is a straight, branched or cyclic alkylene group of 2 to 10 carbon atoms, $R^4$ is hydrogen or a straight, branched or cyclic alkyl group of 1 to 10 carbon atoms, which may contain an oxygen atom, $R^5$ is a tertiary alkyl group of 5 to 20 carbon atoms, p, q and r are positive numbers satisfying p+q+r=1, and (C) a photoacid generator.

2. A chemically amplified positive resist composition according to claim 1 further comprising:

(D) a dissolution regulator.

3. The chemically amplified positive resist composition of claim 2 further comprising (E) a basic compound.

4. A process for forming a resist pattern comprising the steps of:

applying the resist composition of claim 2 onto a substrate to form a coating, heat treating the coating and then exposing it to high-energy radiation or electron beams through a photo mask, and optionally heat treating the exposed coating and developing it with a developer.

5. The chemically amplified positive resist composition of claim 1 further comprising (E) a basic compound.

6. A process for forming a resist pattern comprising the steps of:

applying the resist composition of claim 1 onto a substrate to form a coating, heat treating the coating and then exposing it to high-energy radiation or electron beams through a photo mask, and optionally heat treating the exposed coating and developing it with a developer.

7. A resist composition comprising (A) an or organic solvent.

(B) a base resin of a polymer having recurring units of the following formula (2) and having a weight average molecular weight of 1,000 to 500,000,

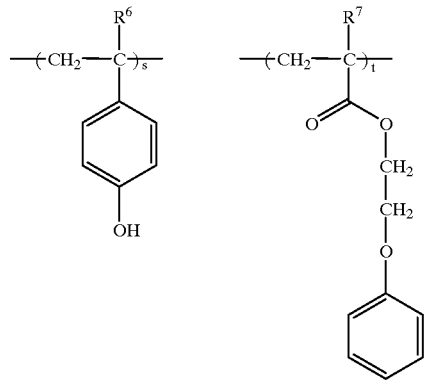

(2)

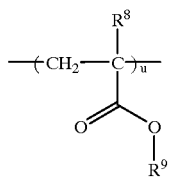

wherein $R^6$, $R^7$ and $R^8$ each are hydrogen or methyl, $R^9$ is a tertiary alkyl group of 5 to 20 carbon atoms, s, t and u are positive numbers satisfying $s+t+u=1$ and (C) a photoacid generator.

* * * * *